United States Patent [19]
Parkin et al.

[11] Patent Number: 5,341,118
[45] Date of Patent: Aug. 23, 1994

[54] MULTILAYER MAGNETIC STRUCTURE WHEREIN THE MAGNITUDE OF THE STRUCTURE MAGNETORESISTANCE IS A FUNCTION OF NONMAGNETIC LAYER THICKNESS

[75] Inventors: Stuart S. P. Parkin; Kevin P. Roche, both of San Jose, Calif.

[73] Assignee: International Business Machines Corporation, Armonk, N.Y.

[21] Appl. No.: 60,462

[22] Filed: May 6, 1993

Related U.S. Application Data

[63] Continuation of Ser. No. 653,567, Feb. 8, 1991.

[51] Int. Cl.$^5$ .............................................. H01L 43/00
[52] U.S. Cl. .................... 338/32 R; 324/252
[58] Field of Search ................ 358/32 R; 324/207.21, 324/252; 204/192.2, 192.21

[56] References Cited

U.S. PATENT DOCUMENTS

| | | | |
|---|---|---|---|
| 3,818,328 | 6/1974 | Zinn | 324/252 |
| 3,848,217 | 11/1974 | Lazzari | 324/252 X |
| 3,898,359 | 8/1975 | Nadkarni | 338/32 R X |
| 4,141,051 | 2/1979 | Kuijk al. | 338/32 R |
| 4,604,176 | 8/1986 | Paul | 204/192 M |
| 4,663,607 | 5/1987 | Kitada et al. | 338/32 R X |
| 4,686,472 | 8/1987 | Van Ooijen et al. | 324/252 |
| 4,912,451 | 3/1990 | Sugiyama et al. | 324/252 X |
| 4,949,039 | 8/1990 | Grünberg | 324/252 |
| 4,950,988 | 8/1990 | Garshelis | 324/207.14 X |
| 5,206,590 | 4/1993 | Dieny et al. | 338/32 R |

FOREIGN PATENT DOCUMENTS

| | | | |
|---|---|---|---|
| 0152000 | 8/1985 | European Pat. Off. | 324/252 |
| 1-217283 | 8/1989 | Japan | 324/252 |
| 2-025777 | 1/1990 | Japan | 324/252 |

OTHER PUBLICATIONS

Suits, "High Magnetic Field Measuring Devices", *IBM/TDB*, vol. 7, No. 6, Nov. 1964, p. 427.

G. Binasch et al., "Enhanced Magnetoresistance in Layered Magnetic Structures with Antiferromagnetic Interlayer Exchange", Physical Review B., vol. 39, Mar. 1, 1989, pp. 4828–4830.

P. Grunberg et al., "Layered Magnetic Structures: Exchange Coupling of Ferromagnetic Layers Across Interlayers", MRS Intl. Mtg. Adv. Mats., vol. 10, no month, 1989, pp. 255–267.

*Primary Examiner*—Marvin M. Lateef
*Attorney, Agent, or Firm*—Otto Schmid, Jr.; Leslie G. Murray

[57] ABSTRACT

A multilayer magnetoresistive (MR) sensor formed on a substrate includes alternating layers of a ferromagnetic material and a non-magnetic metallic material. The ferromagnetic material and the non-magnetic material form bilayers which exhibit the property that the magnetoresistance of the multilayered structure oscillates as a function of thickness of the non-magnetic material. A current flow is produced through the MR sensor, and the variations in the resistivity of the MR sensor are sensed as a function of the magnetic field being sensed.

31 Claims, 11 Drawing Sheets

MULTILAYER MAGNETIC STRUCTURE WHEREIN THE MAGNITUDE OF THE STRUCTURE MAGNETORESISTANCE IS A FUNCTION OF NONMAGNETIC LAYER THICKNESS

This is a continuation of co-pending application Ser. No. 07/653,567 filed Feb. 8, 1991.

After this continuing application is granted a filing date and therefore becomes co-pending with said prior application, please abandon said prior application and add the words "now abandoned" to the above amendment to the Specification.

BACKGROUND OF THE INVENTION

1. Field of the Invention

This invention relates in general to magnetic transducers for reading information signals from a magnetic medium and, in particular, to an improved magnetoresistive read transducer.

2. Description of the Prior Art

The prior art discloses a magnetic transducer referred to as a magnetoresistive (MR) sensor or head which has been shown to be capable of reading data from a magnetic surface at great linear densities. An MR sensor detects magnetic field signals through the resistance changes of a read element made from a magnetic material as a function of the amount and direction of magnetic flux being sensed by the element. These prior art MR sensors operate on the basis of the anisotropic magnetoresistive (AMR) effect in which a component of the resistance varies as $\cos^2$ of the angle between the magnetization and the direction of current flow. These MR sensors have operated on the basis of the AMR effect even though this effect produced only a very small percentage change in the resistance.

More recently, reports have been published of techniques for obtaining enhanced MR effects. One of these publications, "Enhanced Magnetoresistance in Layered Magnetic Structures with Antiferromagnetic Interlayer Exchange", G. Binasch, et al, Physical Review B. V39, p. 4828 (1989) describes a layered magnetic structure which yields enhanced MR effects caused by antiparallel alignment of the magnetization. However the saturation fields required to obtain these changes in resistance were too high and the effect too nonlinear and therefore unsuitable for producing a practical MR sensor.

Another of these publications, "Layered Magnetic Structures: Exchange Coupling of Ferromagnetic Layers Across Interlayers", P. Grunberg et al., MRS Intl. Mtg. Adv. Mats., V. 10, p. 255 (1989), and studies dating back to the 1960's have shown ferromagnetic coupling in such systems decaying monotonically with increasing separation of the magnetic layers for a wide range of systems.

The prior art has not shown such a multilayered system in which the magnetoresistance is high and in which the fields are sufficiently low so that it is useful as an MR sensor.

SUMMARY OF THE INVENTION

It is therefore the principle object of this invention to produce an MR sensor having large magnetoresistance values.

In accordance with the invention, an MR sensor comprises a multilayer structure formed on a substrate comprising alternating layers of a ferromagnetic material and a non-magnetic metallic material, the ferromagnetic material and the non-magnetic material forming bilayers which exhibit the property that the magnetoresistance of the multilayered structure oscillates as a function of thickness of the layers of the non-magnetic material. A current flow is produced through the MR sensor, and the variations in the resistivity of the MR sensor are sensed as a function of the magnetic field being sensed.

By choosing the thickness of the non-magnetic layer to that corresponding to a peak in the magnetoresistance, extraordinarily large saturation magnetoresistance can be achieved, reaching a value in excess of 65% at room temperature and 110% at 4.2 K., which is larger than any previously observed.

The foregoing and other objects, features and advantages of the invention will be apparent from the following more particular description of a preferred embodiment of the invention as illustrated in accompanying drawings.

DESCRIPTION OF THE PREFERRED EMBODIMENTS

According to the present invention, a metallic multilayer structure is provided comprising alternating layers of magnetic and non-magnetic materials. This metallic multilayer structure gives unexpectedly high values of saturation magnetoresistance compared to prior art structures, and it has been found that, for some materials, the magnetoresistance in these structures varies as a function of non-magnetic layer thickness.

Figure 1:
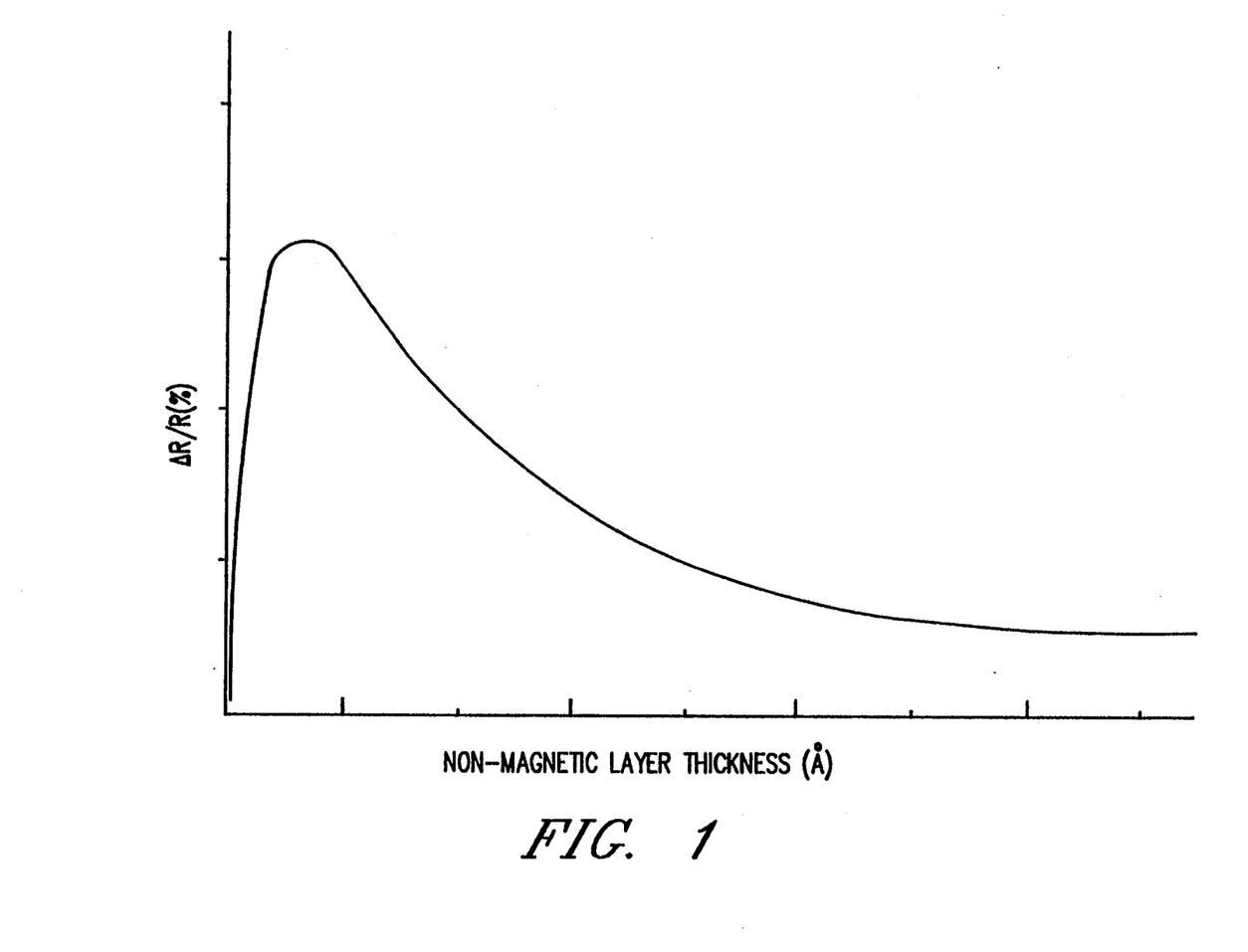
FIG. 1 is a graph showing saturation magnetoresistance as a function of the thickness of the non-magnetic spacer layer in structure comprising ferromagnetic layers separated by a non-magnetic spacer layer according to the prior art teaching.
Figure 2:
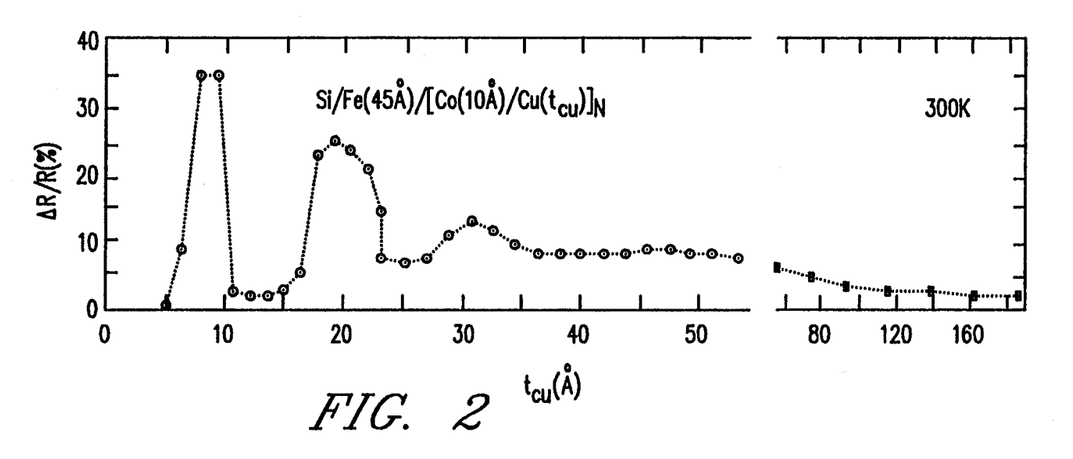
FIG. 2 is a graph showing the saturation magnetoresistance versus non-magnetic layer thickness for a family of related multilayer structures according to the present invention.

As shown in FIG. 1, the prior art teaches that the saturation magnetoresistance for these layered structures decreases monotonically with non-magnetic layer thickness. In contrast to this prior art teaching, we have found that the saturation magnetoresistance varies with non-magnetic layer thickness for some materials combinations as shown in FIG. 2, for example. Note that the magnetoresistance oscillates with non-magnetic layer thickness, with a first peak in this specific embodiment between 9 and 10 Å, a second peak around 19 or 20 Å and a third peak just above 30 Å.

By the use of the materials that exhibit this oscillatory characteristic it is possible to build an MR sensor which produces large changes in magnetoresistance by selecting the thickness of the non-magnetic metallic layer to coincide with that for one of the peaks as shown in FIG. 2, for example.

The materials combinations for the magnetic layers and the non-magnetic layers which produces oscillations, as a function of non-magnetic layer thickness, in the magnitude of saturation magnetoresistance can be chosen by considering their characteristics as revealed by their bulk phase diagram, for example. In general, these material combinations do not form compounds with each other, and there is a large miscibility gap.

Figure 3:
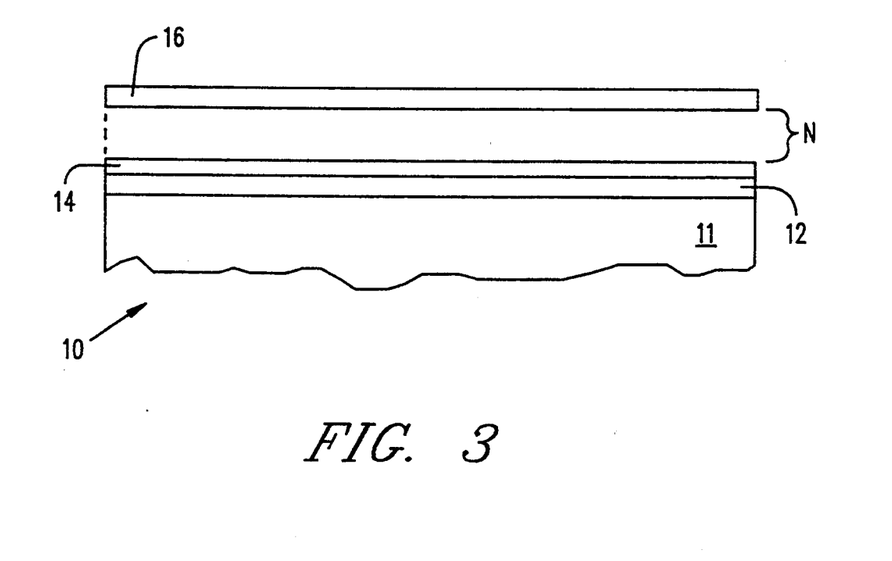
FIG. 3 is an end view of a specific embodiment of a magnetoresistive sensor comprising a bilayer structure according to the present invention.

Specific examples of these material systems will now be given. A specific embodiment of a magnetoresistive (MR) sensor is shown in FIG. 3. The MR sensor 10 comprises a multilayered metallic structure formed on a suitable substrate 11 having alternating layers of ferromagnetic material 12 and non-magnetic metallic material 14. A chosen number N of the material combination of layers 12 and 14 is formed and the assembly is provided with a capping layer 16 which serves as a protective layer to the sensor 10.

Figure 4:
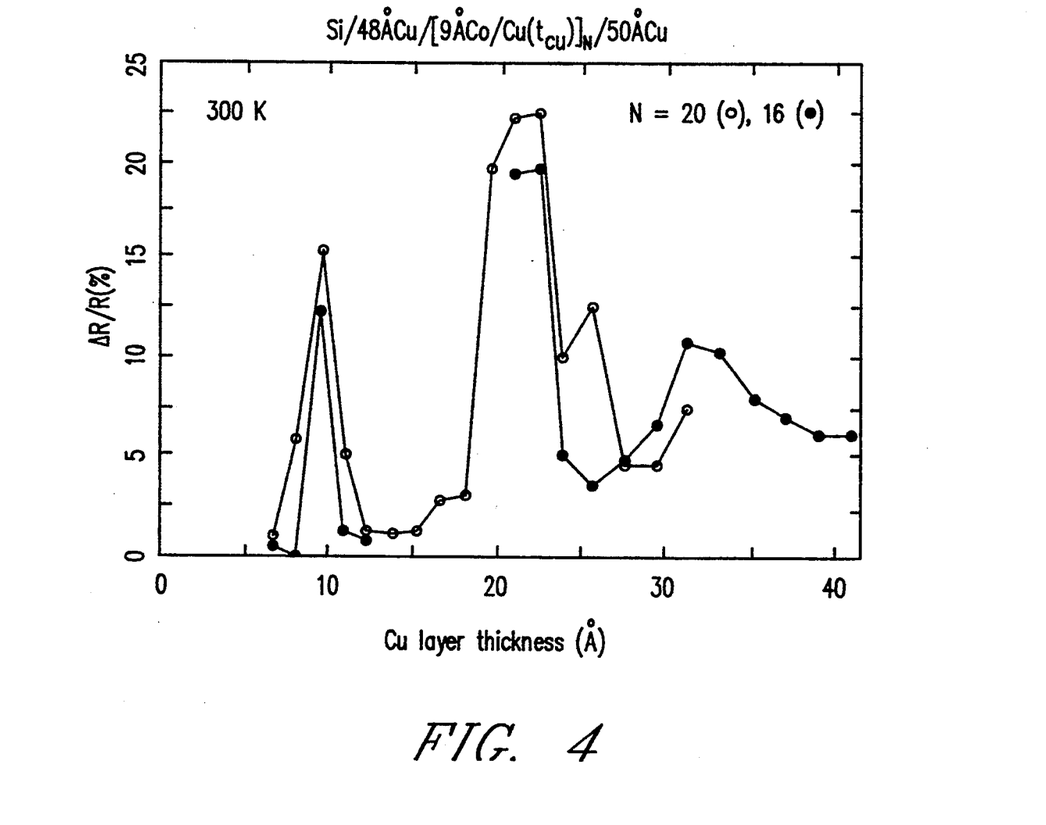
FIG. 4 is a graph showing saturation magnetoresistance versus non-magnetic layer thickness for a specific embodiment of a bilayer structure according to the present invention.

A specific embodiment of the invention shown in FIG. 3 comprises a bilayer structure of the following materials: Si/48 ÅCu/[9 ÅCo/Cu($t_{cu}$)]$_n$/50 ÅCu. This structure was prepared in some samples having 20 bilayers, and others having 16 bilayers and the magnetoresistance of these structures is shown in FIG. 4. The magnetoresistance is somewhat less for the structures having 16 bilayers, but the oscillation is in the same pattern for both the 16 and 20 bilayers structures with peaks around 10, 20 and a little over 30 angstroms of copper. Current shunting through the buffer layer (not shown in FIG. 3, but described below with reference to FIG. 7) and the capping layer 16 reduces the magnitude of the magnetoresistance, but the magnitude of the magnetoresistance can be maximized by choosing the buffer layer and capping layer materials to be of high resistivity and by choosing a large number N of the material layer combinations (40–60, for example).

Figure 5:
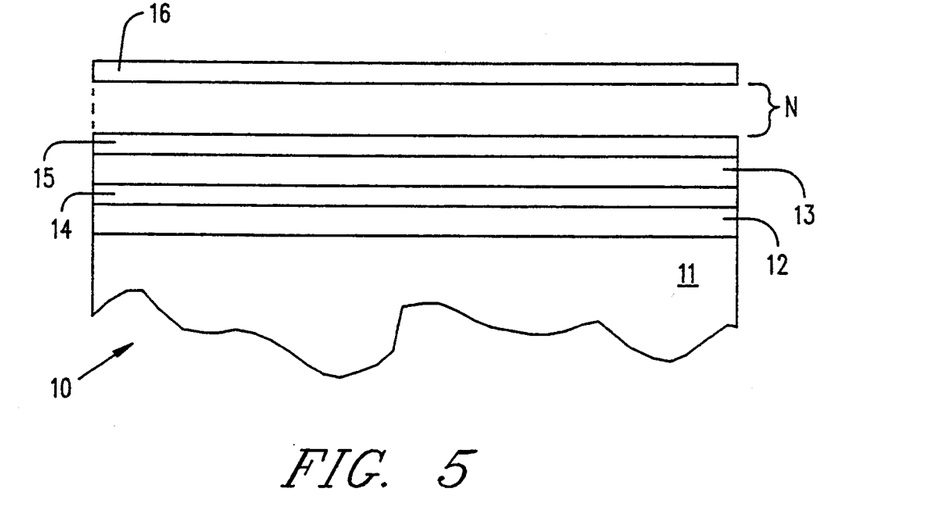
FIG. 5 is an end view of a specific embodiment of a magnetoresistive sensor comprising a quadlayer structure according to the present invention.

The specific embodiment of the invention shown in FIG. 5 comprises a quadlayer structure deposited on substrate 11 which includes a first layer of ferromagnetic material 12, a first layer of non-magnetic metallic material 14, a second layer of ferromagnetic material 13, and a second layer of non-magnetic metallic material 15. A chosen number N of the materials combinations of layers 12, 13, 14 and 15 is formed and the assembly is provided with a capping layer 16.

Figure 6:
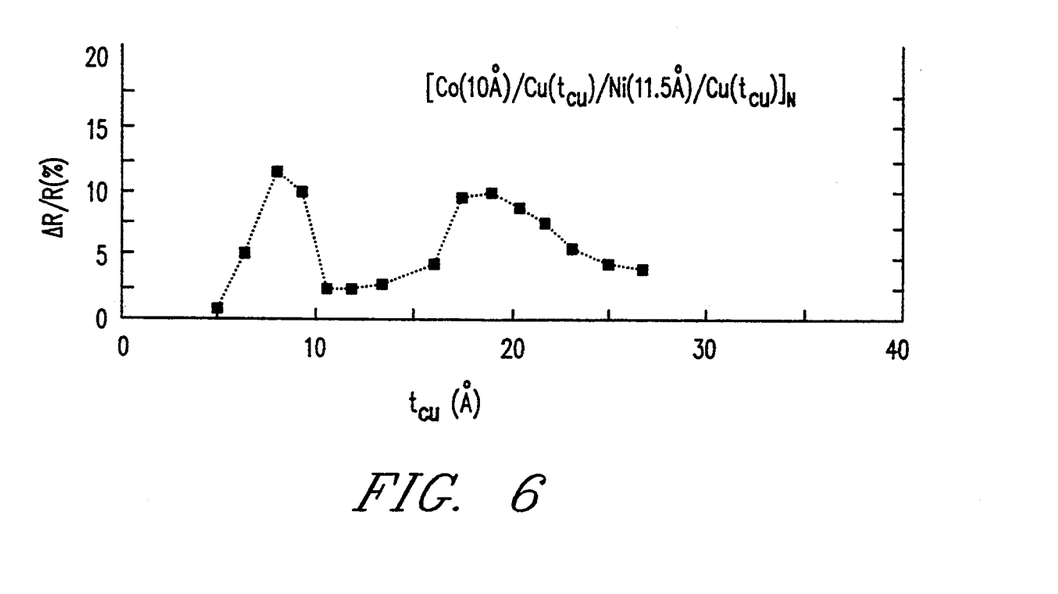
FIG. 6 is a graph showing saturation magnetoresistance versus non-magnetic layer thickness for a specific embodiment of a quadlayer structure according to the present invention.

A specific embodiment of a quadlayer structure according to the invention comprises the following structure: Si/[Co 10 Å/Cu($t_{cu}$)/Ni11.5 Å/Cu($t_{cu}$)]$_n$/ Note that this structure shows, in the graph of FIG. 6, a definite oscillation versus thickness with peaks just below 10 and 20 angstroms.

Figure 7:
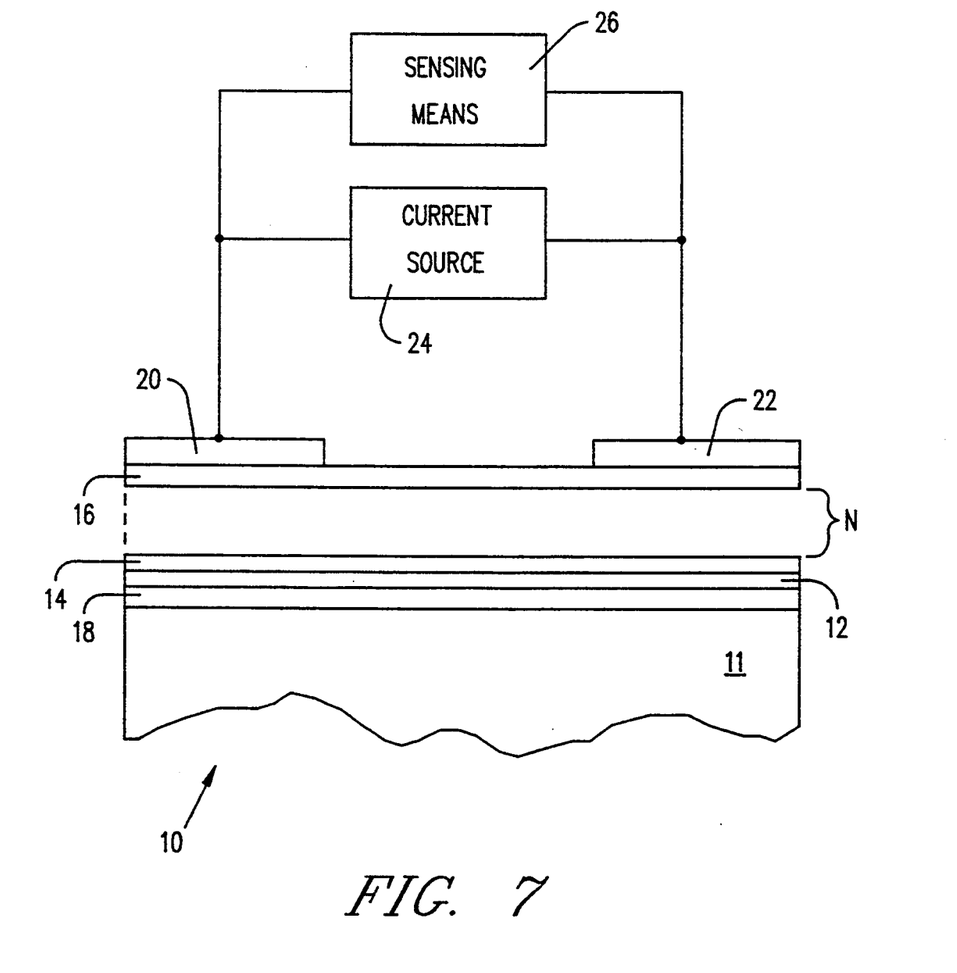
FIG. 7 is an end view of an alternate embodiment of a magnetoresistive sensor comprising a bilayer structure according to the present invention.

It has also been discovered that the giant magnetoresistance effects observed in the layered structures described above can be substantially enhanced by deposition upon certain buffer layers. FIG. 7 shows a bilayer structure similar to that shown in FIG. 3 with the exception that a buffer layer 18 is provided on substrate 11 prior to forming the first ferromagnetic layer 12. Following deposition of the capping layer 16, electrical leads 20 and 22 are provided to form a circuit pattern between the MR sensor structure, current source 24 and sensing means 26.

Figure 8:
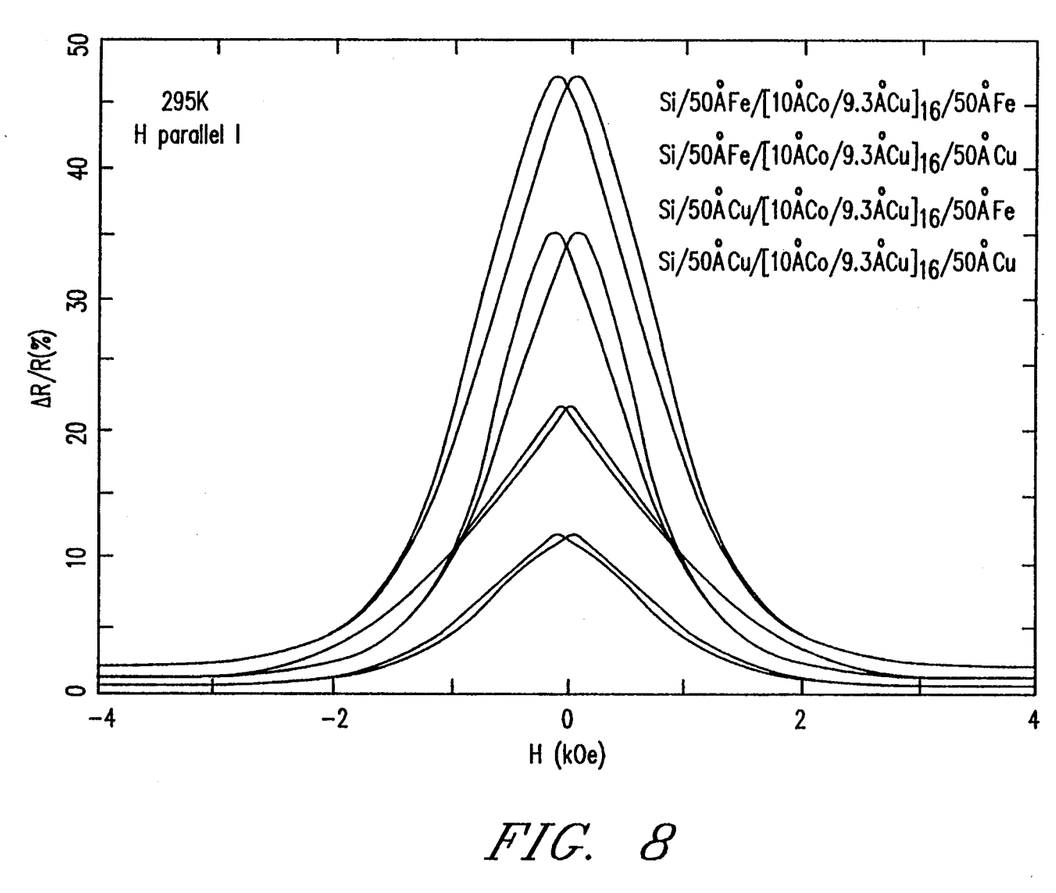
FIG. 8 is a graph showing magnetoresistance versus in-plane magnetic field for four similar structures of the type shown in FIG. 7.

FIG. 8 shows four graphs of bilayer structures which have identical numbers of Co and Cu layers but which have various combination of Fe and Cu for the buffer layer 18 and the capping layer 16. These graphs show a variation in the saturation magnetoresistance by more than a factor of three. These differences are due to reduced current shunting through the buffer 18 layer and by changes in the growth morphology of the thin films of the structure.

Figure 9:
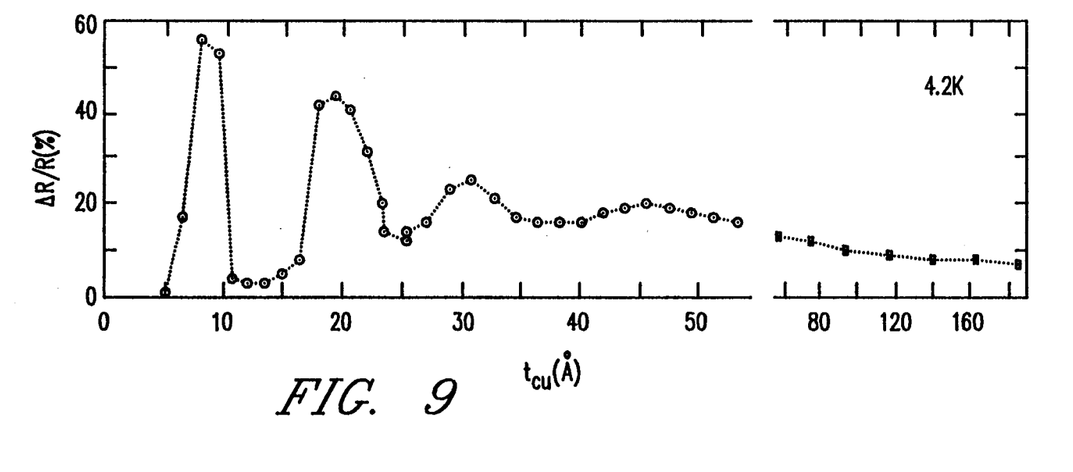
FIG. 9 is a graph showing the saturation magnetoresistance versus non-magnetic layer thickness for the family of structures shown in FIG. 2, but taken at a temperature of 4.2 K.

The buffer 18 layer material must be chosen for optimum magnetoresistance. The first consideration is that it must not react with the substrate material, and the second requirement is flatness since this appears to be important, particularly for thin non-magnetic spacer layers (i.e., in the vicinity of the first peak as shown in FIGS. 2 or 9, for example). In addition, the buffer 18 layer should be as thin as possible to minimize current shunting effects while at the same time insuring that the buffer layer is a continuous layer. The buffer layer may comprise Fe, Ru, Cu, Rh, Ir, Re, or Cr, for example, and suitable thicknesses for Fe comprise a range of about 15 to 50 angstroms.

The graph of FIG. 2 is a specific example of a structure having a buffer layer and has the following structure: Si/Fe 45 Å/[Co 10 Å/Cu($t_{cu}$)]$_n$ The data plotted in FIG. 2 was taken at room temperature, 300° K., and data from the same structure, but operated at Helium temperature (4.2 K.), is shown in FIG. 9. These two graphs are similar and demonstrate that the peaks in magnetoresistance are independent of temperature.

Figure 10:
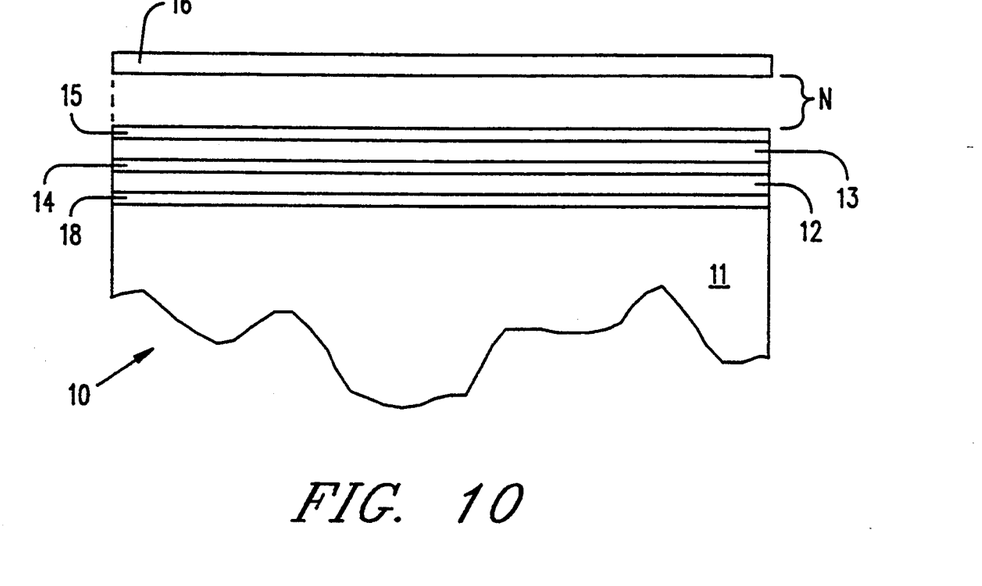
FIG. 10 is an end view of an alternate embodiment of a magnetoresistive sensor comprising a quadlayer structure according to the present invention.

FIG. 10 shows an MR sensor comprising a quadlayer structure similar to that shown in FIG. 5 with the exception that a buffer layer 18 is provided on substrate 11 prior to forming the first ferromagnetic layer 12. A specific embodiment of a quadlayer structure having a buffer layer comprises the following structure: Si/Ru 100 Å/[Co 16 Å/Ru($t_s$)/Ni45 Å/Ru($t_s$)]$_{10}$/Ru50 Å

Figure 11:
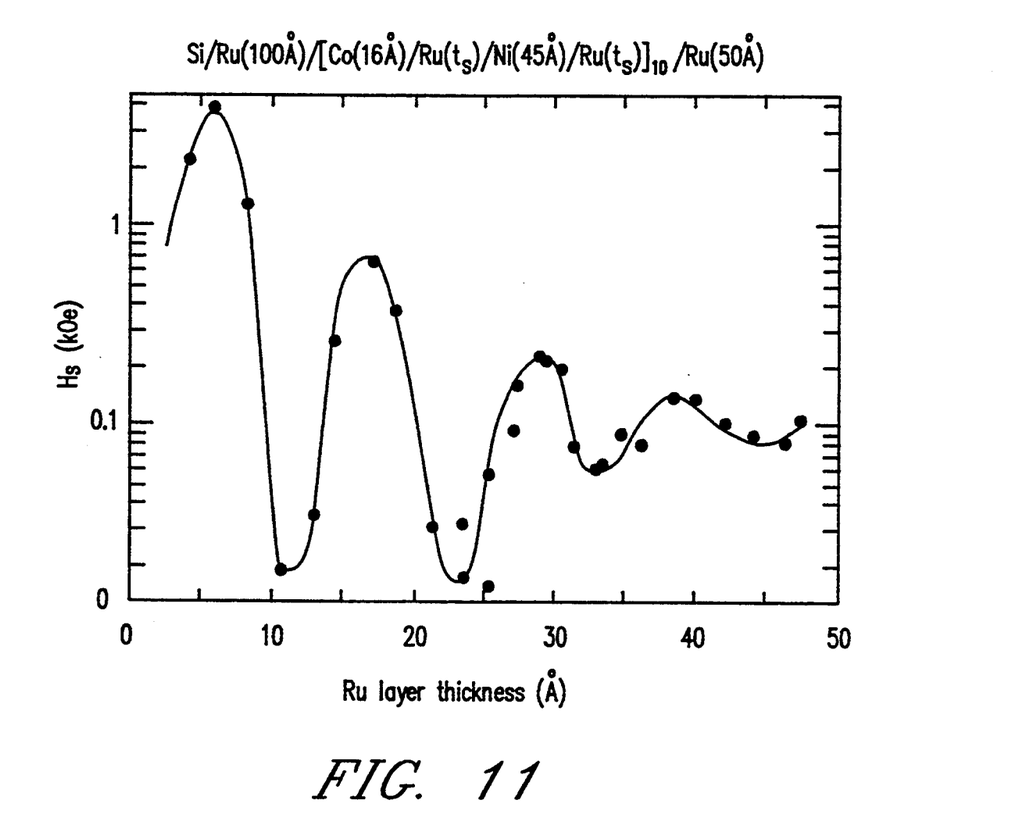
FIG. 11 is a graph showing saturation field versus non-magnetic layer thickness for a structure of the type shown in FIG. 10.

The saturation field vs thickness of the spacer layer 14, 15 for this structure is shown in FIG. 11. Note that there are peaks in the saturation field below 10 Å, below 20 Å and near 30 Å. This graph demonstrates that the saturation field and the saturation magnetoresistance are closely related and that their magnitude oscillates as a function of thickness of the Ru spacer layer with a period of approximately 8–10 Å. The peaks in the saturation field fall off more quickly with non-magnetic spacer layer approximately $1/t_s$, thickness than do the peaks in magnetoresistance. Whereas the peaks in saturation field vary as $1/(t_s)^P$, where P is approximately 1.7 to 2, the peaks in magnetoresistance vary as approximately $1/t_s$.

Figure 12:
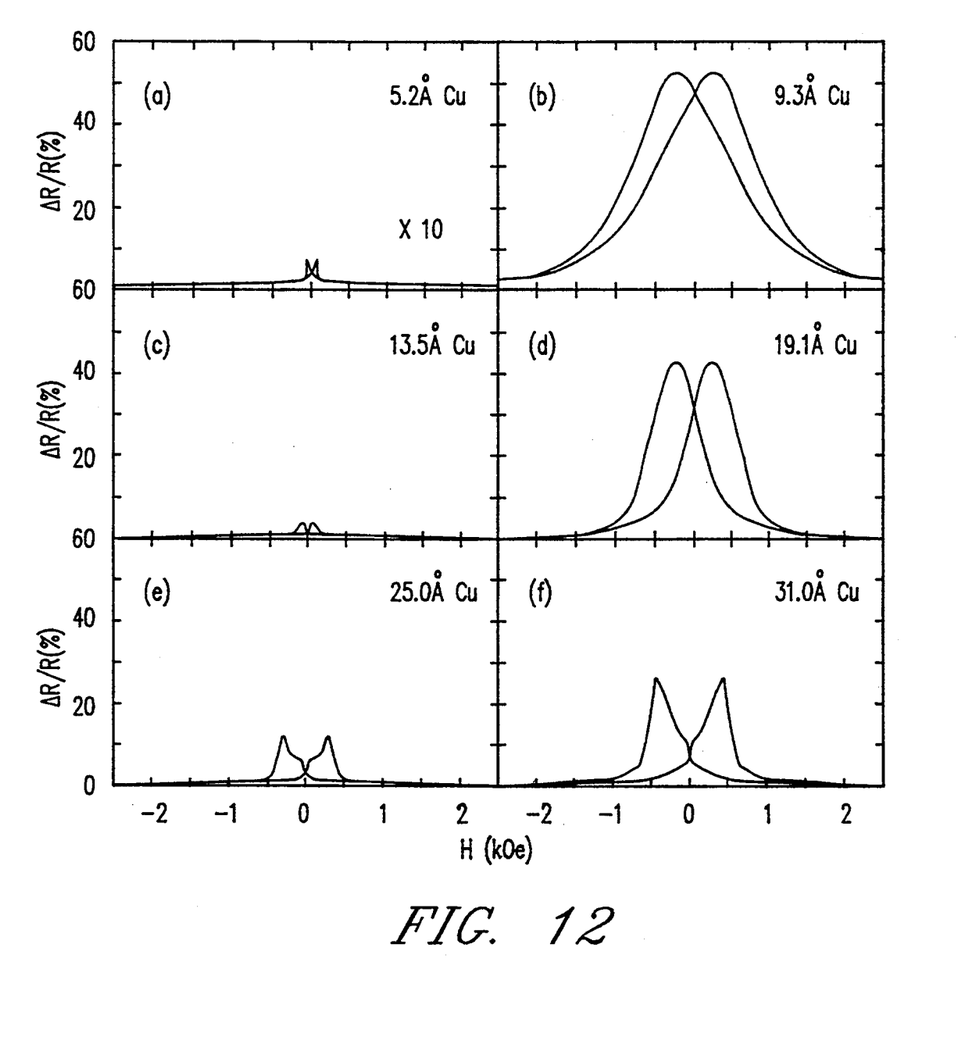
FIG. 12 is a series of graphs (a)–(f) showing the magnetoresistance versus in-plane magnetic field for six representative structures of the type shown in FIG. 7.

FIG. 12 shows magnetoresistance vs field curves for six identical Co/Cu bilayer structures with varying copper spacer layer thickness. This structure comprises: Si/Fe 40 Å/[Co 10 Å/Cu($t_{cu}$)]$_{16}$. Clearly the magnitude of the magnetoresistance is very small for Cu layer thickness of 5.3 Å, but becomes large for a thickness of 9.3 Å. With increasing Cu layer thickness the magnitude of the magnetoresistance oscillates from small to large values as shown in FIG. 12.

It can also be seen that the field required to produce the magnetoresistance response also varies with thickness of the Cu layer. For example, the first peak at 9.3 Å Cu has a magnetoresistance of about 55%. However, the field required is ~3 KOe. The second peak at 19.1 Å Cu has a lower magnetoresistance of about 45%, and also a lower field of about ~5 KOe. By the use of this data, a choice can be made in Cu layer thickness to operate at the first peak for maximum magnetoresistance, or at the second peak for large magnetoresistance but at a lower field.

Figure 13:
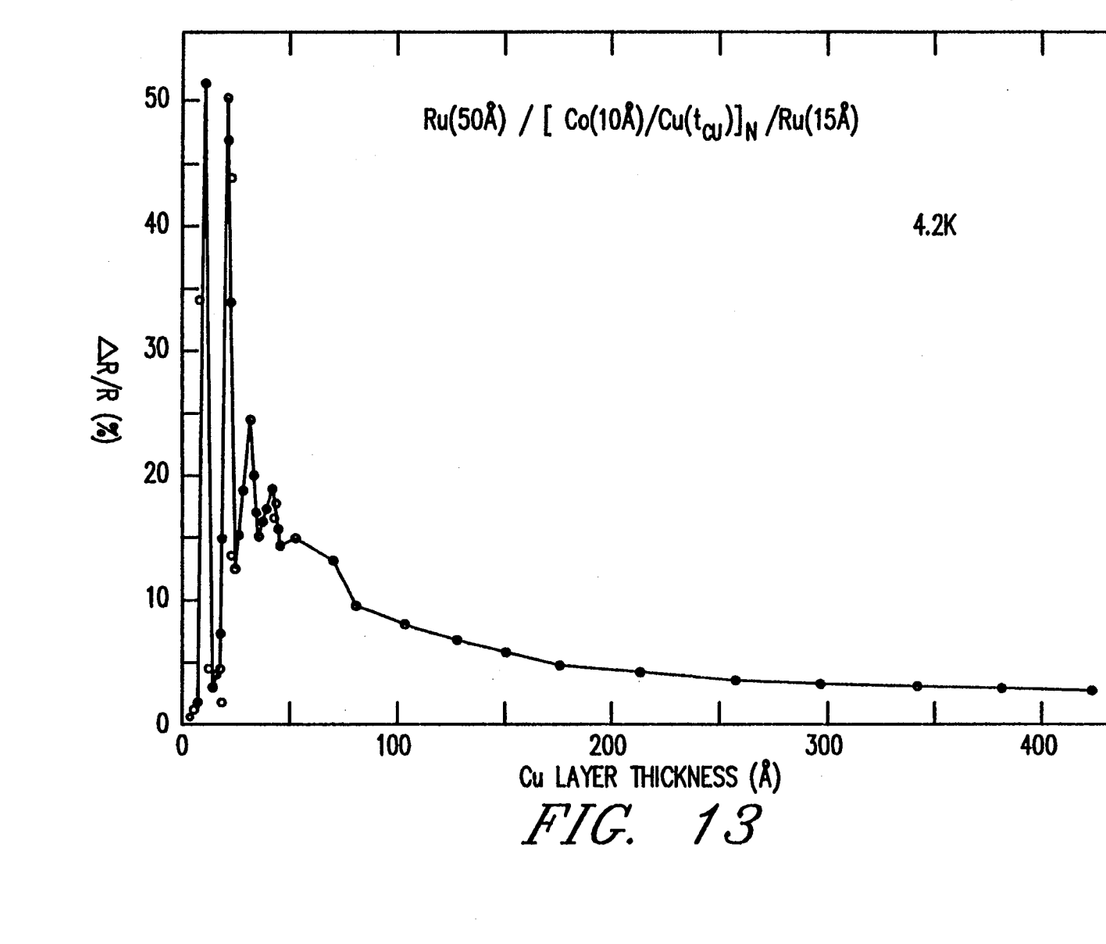
FIG. 13 is a graph showing the magnetoresistance versus non-magnetic layer thickness for a structure of the type shown in FIG. 7.

FIG. 13 shows data for a specific embodiment of an MR sensor having the following structure: Si/Ru 50 Å/[Co 10 Å/Cu($t_{cu}$)]$_n$/Ru 15 Å This data shows oscillations in the magnetoresistance, and these oscillations are substantially damped at a copper layer thickness of about 60 Å. At larger copper layer thickness, the magnetoresistance varies as the inverse copper layer thickness. This data also shows large values of magnetoresistance for extremely large copper layer thickness of up to more than 400 angstroms.

Figure 14:
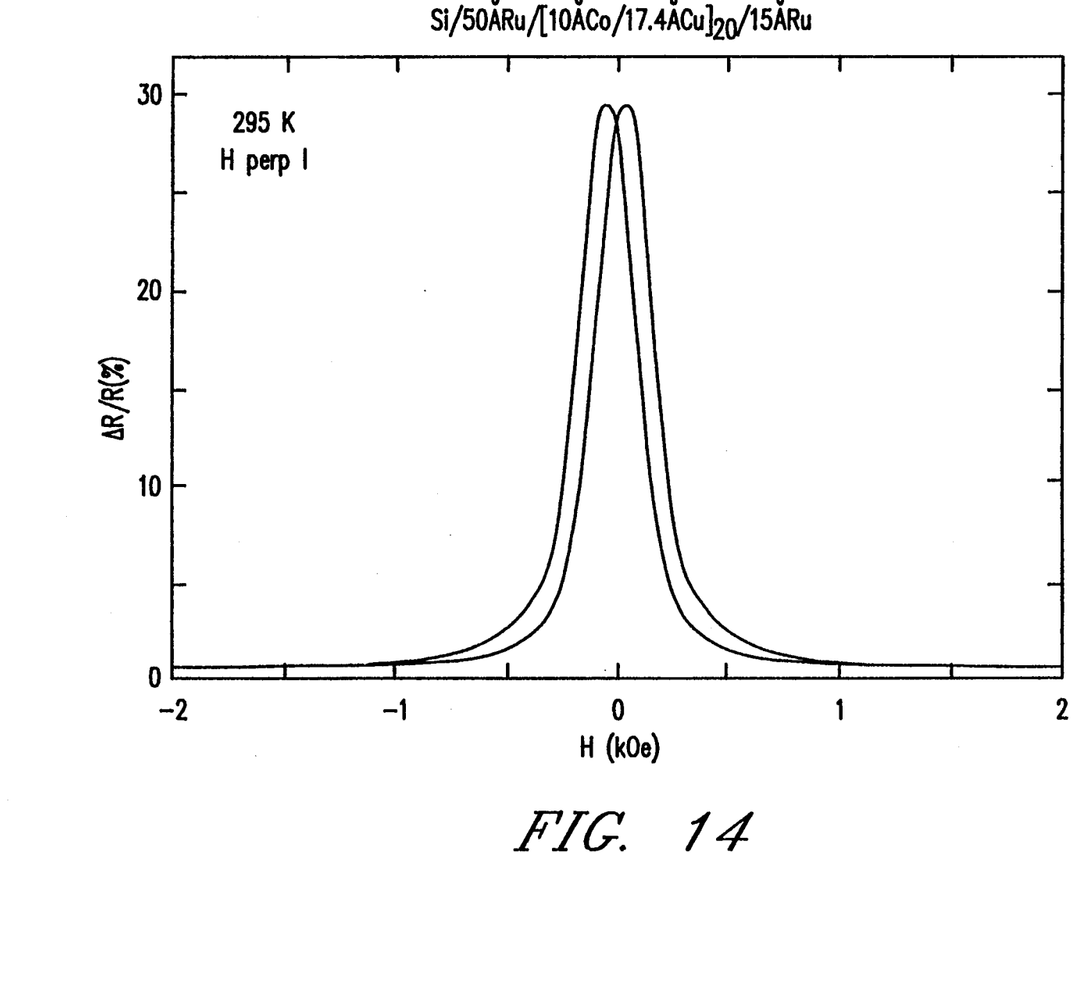
FIG. 14 is a graph showing the magnetoresistance versus magnetic field for a structure of the type shown in FIG. 7 which shows high magnetoresistance at low field.

An example of a structure that produces somewhat lower magnetoresistance of 28% at still lower fields is shown in FIG. 14. This structure comprises: Si/50 Å Ru/[10 Å Co/17.4 Å Cu]$_{20}$/15 Å Ru Extensive examples have been given of different materials combinations that show the characteristics of oscillation of saturation magnetoresistance with non-magnetic layer thickness. Specific materials combinations comprise Fe/Cr and Co/Cr. Cu generally works with most ferromagnetic materials such as Co/Cu, NiFe/Cu, Co/Cu/Ni/Cu, Co/Cu/Fe/Cu, Co/Cu/-NiFe/Cu and Co/Cu/NiCo/Cu, for example. Ru generally works with most ferromagnetic materials such as Fe/Ru, Co/Ru, Ni/Ru, NiFe/Ru, NiCo/Ru, Fe/Ru/-Co/Ru, Co/Ru/Ni/Ru, Co/Ru/NiCo/Ru, and Co/-Ru/NiFe/Ru, for example. Ir, Re, and Rh also generally work with most ferromagnetic materials.

Figure 15:
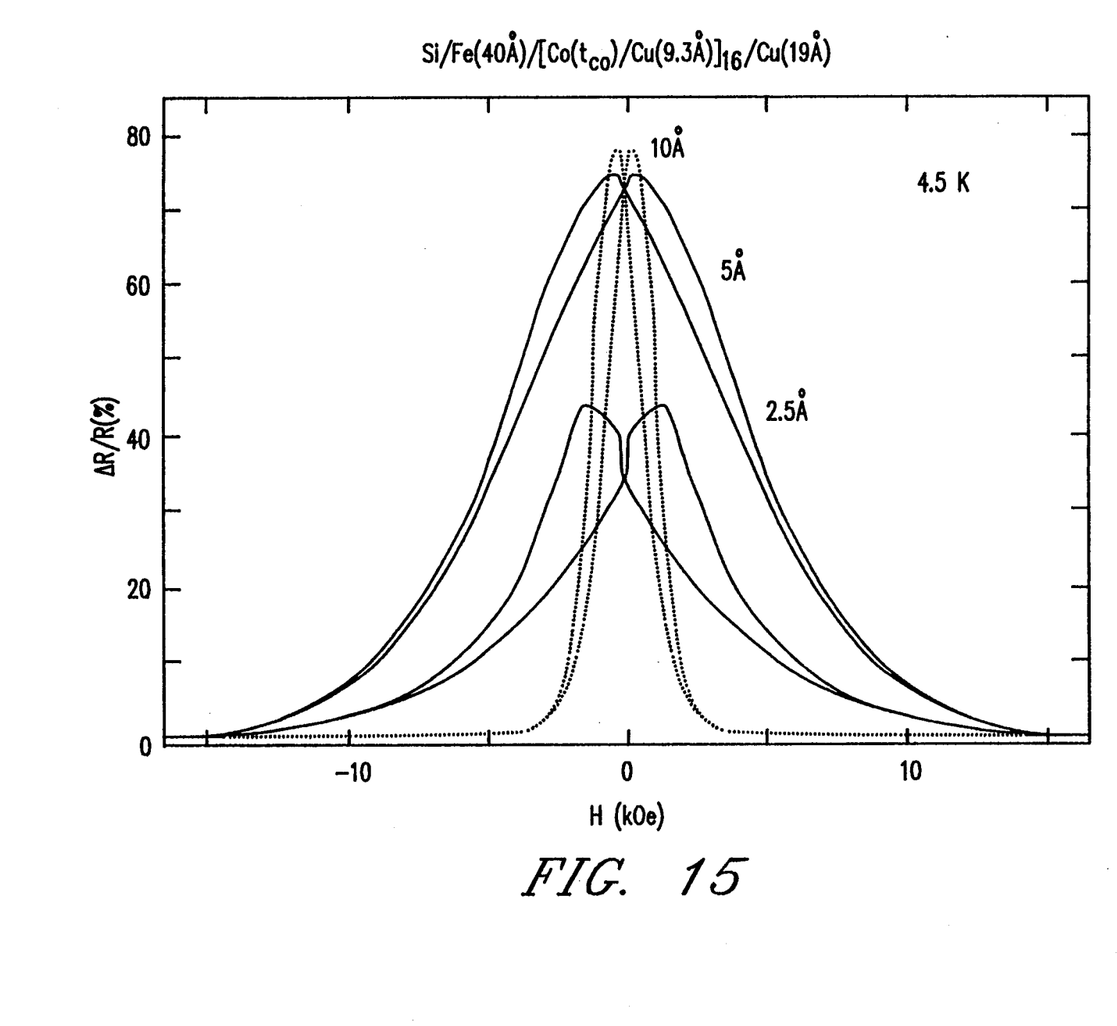
FIG. 15 is a graph showing magnetoresistance versus in plane magnetic field for three structures of the type shown in FIG. 7, but with varying thickness of the ferromagnetic layer.

The thickness of the ferromagnetic layer also has an influence on the magnetoresistance and it can be shown that the thickness of the ferromagnetic layer should be as thin as possible. However, FIG. 15 shows transverse magnetoresistance versus in-plane field for three bilayer structures of the form: Si/Fe40 Å[Co($t_{co}$)/Cu 9.3 Å]$_{16}$/Cu 19 Å. These curves show a large variations in both magnetoresistance and field with ferromagnetic layer thickness. As the cobalt layer thickness is increased above ~10 Å, the magnitude of the saturation magnetoresistance decreases approximately as the inverse cobalt layer thickness.

We have described an MR sensor which utilizes combinations of ferromagnetic materials and non-magnetic metallic materials which exhibit the property that the magnetoresistance of the multilayered structure oscillates as a function of the thickness of the non-magnetic material layer. By choosing the thickness of the non-magnetic material to that corresponding to a peak in the magnetoresistance, a very large magnetoresistance, in excess of 60%, can be achieved.

While the invention has been particularly shown and described with reference to a preferred embodiment thereof, it will be understood by those skilled in the art that various other changes in the form and details may be made therein without departing from the spirit and scope of the invention.

What is claimed is:

1. A multilayered magnetic structure comprising:
   at least two bilayers, each bilayer comprising a layer of a ferromagnetic material and a layer of a nonmagnetic metallic material having a predetermined thickness, the value of the magnetoresistance of said multilayered structure exhibiting the property that its magnitude oscillates as a function of thickness of said layer of nonmagnetic metallic material, the thickness of said layer of nonmagnetic metallic material selected to correspond to a peak of said oscillatory function.

2. A multilayered magnetic structure as in claim 1 wherein said oscillatory function comprises at least a first and a second peak value for the magnetoresistance of said multilayered structure.

3. A multilayered magnetic structure as in claim 2 wherein the thickness of said nonmagnetic metallic layer is selected to correspond to said first peak of said oscillatory function.

4. A multilayered magnetic structure as in claim 1 wherein the thickness of said nonmagnetic metallic layer is selected to correspond to said second peak of said oscillatory function.

5. A multilayered magnetic structure as in claim 1 wherein said layer of nonmagnetic metallic material is formed of a material selected from the group consisting of copper, chromium, ruthenium, iridium, rhenium and rhodium.

6. A multilayered magnetic structure as in claim 5 wherein said layer of nonmagnetic metallic material is formed of copper.

7. A multilayered magnetic structure as in claim 6 wherein said layer of ferromagnetic material is formed of a material selected from the group consisting of cobalt, nickel-iron and nickel-cobalt.

8. A multilayered magnetic structure as in claim 5 wherein said layer of nonmagnetic metallic material is formed of ruthenium.

9. A multilayered magnetic structure as in claim 8 wherein said layer of ferromagnetic material is formed of a material selected from the group consisting of iron, nickel, cobalt, nickel-iron and nickel-cobalt.

10. A multilayered magnetic structure comprising:
    at least two quadlayers, each quadlayer comprising a layer of a first ferromagnetic material, a first layer of a nonmagnetic metallic material, a layer of a second ferromagnetic material and a second layer of a nonmagnetic metallic material, the value of the magnetoresistance of said multilayered structure exhibiting the property that its value oscillates as a function of thickness of said layers of nonmagnetic metallic material, the thicknesses of said first and second layers of nonmagnetic metallic material selected to correspond to a peak of said oscillatory function.

11. A multilayered magnetic structure as in claim 10 wherein said oscillatory function comprises at least a first and a second peak value for the magnetoresistance of said multilayered structure.

12. A multilayered magnetic structure as in claim 11 wherein the thickness of said nonmagnetic metallic layer is selected to correspond to said first peak of said oscillatory function.

13. A multilayered magnetic structure as in claim 11 wherein the thickness of said nonmagnetic metallic layer is selected to correspond to said second peak of said oscillatory function.

14. A multilayered magnetic structure as in claim 10 wherein said layer of nonmagnetic metallic material is formed of a material selected from the group consisting of copper, chromium, ruthenium, iridium, rhenium and rhodium.

15. A multilayered magnetic structure as in claim 14 wherein said layers of nonmagnetic metallic material are formed of copper.

16. A multilayered magnetic structure as in claim 15 wherein said first and second layers of ferromagnetic material are formed, respectively, of materials selected from the group consisting of cobalt and nickel, cobalt and iron, cobalt and nickel-iron and cobalt and nickel-cobalt.

17. A multilayered magnetic structure as in claim 14 wherein said layers of nonmagnetic metallic material are formed of a material selected from the group consisting of ruthenium, iridium, rhenium and rhodium.

18. A multilayered magnetic structure as in claim 17 wherein said first and second layers of ferromagnetic material are formed, respectively, of materials selected from the group consisting of cobalt and iron, cobalt and nickel, cobalt and nickel-iron, and nickel and iron.

19. A magnetoresistive sensor comprising:
a substrate; and
a magnetoresistive layer formed on said substrate, said magnetoresistive layer comprising a plurality of N bilayers, each bilayer comprising a layer of a ferromagnetic material and a layer of a nonmagnetic metallic material having a predetermined thickness, the value of the magnetoresistance of said multilayered structure exhibiting the property that its magnitude oscillates as a function of thickness of said layer of nonmagnetic metallic material, the thickness of said layer of nonmagnetic metallic material selected to correspond to a peak of said oscillatory function.

20. The magnetoresistive sensor of claim 19 further comprising a buffer layer formed on said substrate disposed between said substrate and said magnetoresistive layer.

21. The magnetoresistive sensor of claim 20 wherein said buffer layer is formed of a material selected from the group consisting of iron, copper, chromium, ruthenium, rhodium, iridium and rhenium.

22. The magnetoresistive sensor of claim 19 further comprising a capping layer overlaying and covering said magnetoresistive layer.

23. The magnetoresistive sensor of claim 22 wherein said capping layer is formed of a material having a relatively high electrical resistivity.

24. The magnetoresistive sensor of claim 19 wherein the number N of said bilayers is in the range of forty to sixty.

25. The magnetoresistive sensor of claim 19 wherein said magnetoresistive layer comprises twenty said bilayers formed on said buffer layer.

26. A magnetoresistive sensor comprising:
a substrate; and
a magnetoresistive layer formed on said substrate, said magnetoresistive layer comprising a plurality of N quadlayers, each quadlayer comprising a layer of a first ferromagnetic material, a first layer of a nonmagnetic metallic material, a layer of a second ferromagnetic material and a second layer of a nonmagnetic metallic material, the value of the magnetoresistance of said multilayered structure exhibiting the property that its value oscillates as a function of thickness of said layers of nonmagnetic metallic material, the thicknesses of said first and second layers of nonmagnetic metallic material selected to correspond to a peak of said oscillatory function.

27. The magnetoresistive sensor of claim 26 further comprising a buffer layer formed on said substrate between said substrate and said magnetoresistive layer.

28. The magnetoresistive sensor of claim 27 wherein said buffer layer is formed of a material selected from the group consisting of iron, copper, chromium, ruthenium, rhodium, iridium and rhenium.

29. The magnetoresistive sensor of claim 26 wherein said magnetoresistive layer comprises ten said quadlayers formed on said buffer layer.

30. The magnetoresistive sensor of claim 26 further comprising a capping layer overlaying and covering said magnetoresistive layer.

31. The magnetoresistive sensor of claim 30 wherein said capping layer is formed of a material having a relatively high electrical resistivity.

* * * * *

UNITED STATES PATENT AND TRADEMARK OFFICE
CERTIFICATE OF CORRECTION

PATENT NO. : 5,341,118
DATED : August 23, 1994
INVENTOR(S) : S. Parkin et al.

It is certified that error appears in the above-indentified patent and that said Letters Patent is hereby corrected as shown below:

Column 4, line 47, after "buffer", delete "18".

Column 4, line 48, after "layer", insert -- 18 --.

Column 7, line 22, delete "layer", insert -- layers --.

Column 7, line 22, delete "is", insert --are--.

Signed and Sealed this

Twentieth Day of December, 1994

Attest:

BRUCE LEHMAN

*Attesting Officer*  *Commissioner of Patents and Trademarks*